United States Patent
Murakami

(10) Patent No.: US 6,810,509 B2
(45) Date of Patent: Oct. 26, 2004

(54) METHOD OF EVALUATING SEMICONDUCTOR INTEGRATED CIRCUIT TO BE DESIGNED IN CONSIDERATION OF STANDBY DC LEAKAGE CURRENT

(75) Inventor: Hideaki Murakami, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/274,114

(22) Filed: Oct. 21, 2002

(65) Prior Publication Data

US 2003/0188277 A1 Oct. 2, 2003

(30) Foreign Application Priority Data

Nov. 9, 2001 (JP) ........................................ 2001-345295

(51) Int. Cl.[7] ............................................. G06F 17/50
(52) U.S. Cl. ................................... 716/4; 716/5; 716/6
(58) Field of Search ..................... 716/4–6, 2; 257/401, 257/65, 355, 356

(56) References Cited

U.S. PATENT DOCUMENTS

| | | | |
|---|---|---|---|
| 5,796,638 A | * | 8/1998 | Kang et al. ..................... 716/5 |
| 6,086,627 A | * | 7/2000 | Bass et al. ...................... 716/5 |
| 6,128,768 A | | 10/2000 | Ho |
| 6,311,147 B1 | | 10/2001 | Tuan et al. |
| 6,407,434 B1 | * | 6/2002 | Rostoker et al. ............ 257/401 |
| 6,553,542 B2 | * | 4/2003 | Ramaswamy et al. ......... 716/2 |

OTHER PUBLICATIONS

Jinlong Zhang et al., "Oates, A.S.;Design optimization of stacked gate oxides with easy evaluation of gate leakage in deep submicron MOSFET", Device Research Conference, 2000. Conference Digest. 58th DRC, Jun. 19–21, 2000, pp.: 69–70.*

Bowman, K.A. et al., "A physical alpha–power law MOSFET model", Solid–State Circuits, IEEE Journal of , vol.: 34, Issue: Oct. 10, 1999, pp.: 1410–1414.*

Planes, N. et al., "Impact of gate current on first order parameter extraction in sub–0.1 /spl mu/m CMOS technologies", Microelectronic Test Structures, 2003. International Conference on , Mar. 17–20, 2003, pp.: 3–141.*

* cited by examiner

Primary Examiner—Matthew Smith
Assistant Examiner—Naum Levin
(74) Attorney, Agent, or Firm—Oblon, Spivak, McClelland, Maier & Neustadt, P.C.

(57) ABSTRACT

First, circuit simulation programs are executed based on electric information of a schematic of a semiconductor integrated circuit. Then, LVS (layout versus schematic) programs are executed using the electric information of the schematic and physical layout information corresponding to the schematic. The semiconductor integrated circuit is therefore evaluated by processing circuit design value information obtained from the circuit simulation programs and layout information obtained by execution of the LVS programs.

12 Claims, 5 Drawing Sheets

METHOD OF EVALUATING SEMICONDUCTOR INTEGRATED CIRCUIT TO BE DESIGNED IN CONSIDERATION OF STANDBY DC LEAKAGE CURRENT

CROSS-REFERENCE TO RELATED APPLICATIONS

This application is based upon and claims the benefit of priority from the prior Japanese Patent Application No. 2001-345295, filed Nov. 9, 2001, the entire contents of which are incorporated herein by reference.

BACKGROUND OF THE INVENTION

1. Field of the Invention

The present invention relates to a technique of designing a semiconductor integrated circuit by CAD (computer aided design). More specifically, the invention relates to a method of evaluating a semiconductor integrated circuit to be designed in consideration of standby DC leakage current.

2. Description of the Related Art

In the design of a semiconductor integrated circuit by CAD, a threshold voltage of an FET has to be set in consideration of a tradeoff between reliability and performance (speed) of the circuit. In the case of an N-channel FET, standby current reduces due to a shift in threshold voltage in the positive direction under the influence of hot carriers. Though the reduction in standby current is preferable in terms of low power consumption, it lowers circuit performance, especially operation speed. In the case of a P-channel FET, a threshold voltage shifts in the direction that decreases the absolute value of the threshold voltage. If standby current increases as subthreshold current does, the circuit can be improved in performance or speed. However, there is fear that a semiconductor integrated circuit such as an IC and an LSI will not meet a value of the standby current required as the specifications of the circuit.

In the design of a semiconductor integrated circuit, therefore, the minimum initial threshold voltage that inhibits the speed from decreasing and satisfying an amount of standby current required as specifications has to be determined.

In the design of a semiconductor integrated circuit by CAD, conventionally, a value that is one-fourth of the total of channel widths of FETs in the circuit is used to determine the minimum threshold voltage of an N-channel FET. However, the value is estimated in accordance with the number of n-channel FETs in a CMOS inverter chain circuit and simply represented as an approximation. In order to produce more correct results, transistors to be cut off in standby mode should be detected and the total of channel widths of the transistors should be computed.

The problem of recent CMOS technology is that parasitic transistors are formed on a boundary between an active area and an element isolation region that gate electrodes of FETs cross and a threshold voltage is lowered by a trap of charges of the parasitic transistors. When a degree of integration was low, the influence of the above parasitic transistors was so small that it hardly became a problem. However, as the transistors decrease in size in accordance with an improvement in packing density, the influence of the parasitic transistors cannot be ignored.

There is case where a transistor having a great channel width (a large current driving capacity) has to be formed in a small space in order to actually form a pattern of a designed circuit. In this case, a multi-finger transistor is used as shown in FIG. 1. FIG. 1 is a pattern plan view schematically showing a structure of the multi-finger transistor (FET). In the multi-finger transistor, a gate insulation film is formed on an active area AA serving as source and drain regions, and gate polysilicon layers (fingers F1 to F3) are formed on the gate insulation film. Edges P1$a$, P1$b$, P2$a$, P2$b$, P3$a$ and P3$b$ are formed at intersections of a boundary between the active area AA and the element isolation region and the fingers F1 to F3.

As illustrated in FIG. 2, parasitic transistors Qpa and QPb are formed at their respective edges Pa and Pb at the intersections of the above boundary and the finger F. The parasitic transistors Qpa and QPb are connected in parallel with a main transistor Q. Even though the main transistor Q is cut off in standby mode, DC leakage current flow through current paths of the parasitic transistors Qpa and QPb.

Using a multi-finger transistor, it comes to have four or more edges (six edges in FIG. 1) on the actual pattern layout though it must have only two edges (parasitic transistors) on the circuit design. The analysis of leakage current due to such edges could not be conducted by the entire chip until now because there were no methods of counting huge numbers of edges of MOSFETs after the layout was completed.

Consequently, a large displacement is caused between a circuit and a pattern layout in the foregoing prior art evaluation method using approximation and estimation. It is thus likely that a semiconductor integrated circuit will not be correctly evaluated or a finished semiconductor integrated circuit will not meet the specifications of standby DC leakage current.

The above-described prior art method of evaluating a semiconductor integrated circuit decreases in precision and reliability since the evaluation is performed by approximation and estimation. The method is therefore desired to improve.

BRIEF SUMMARY OF THE INVENTION

According to an aspect of the present invention, there is provided a method of evaluating a semiconductor integrated circuit, comprising a first block which simulates a circuit design value, the first block creating a file including a bias state of a MOSFET using a circuit simulator and an input file, a second block which extracts physical layout information from results of execution of LVS programs, and a third block which acquires final results by linking an output file of the first block and that of the second block to each other, the first block including inputting electric information of a schematic to a netlister and creating a netlist by the netlister, and performing a simulation by the circuit simulator using data of the netlist and an input stimulus and creating a file of simulation results, the second block including verifying whether data of a layout pattern and that of the schematic are equivalent to each other and creating a file of verification results, and creating a finger-model table file from the file of verification result in line with an actual pattern layout, and the third block including performing a circuit simulation in line with an actual pattern layout upon receiving the simulation results from the first block and the finger-model table file from the second block, and creating a result file by evaluation.

DETAILED DESCRIPTION OF THE INVENTION

Figure 1:
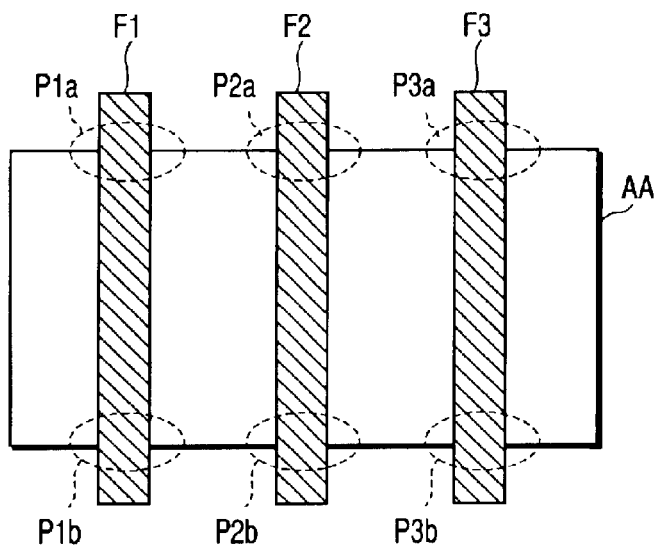
FIG. 1 is a plan view schematically showing a pattern layout of multi-finger transistors to explain a prior art method of evaluating a semiconductor integrated circuit.
Figure 2:
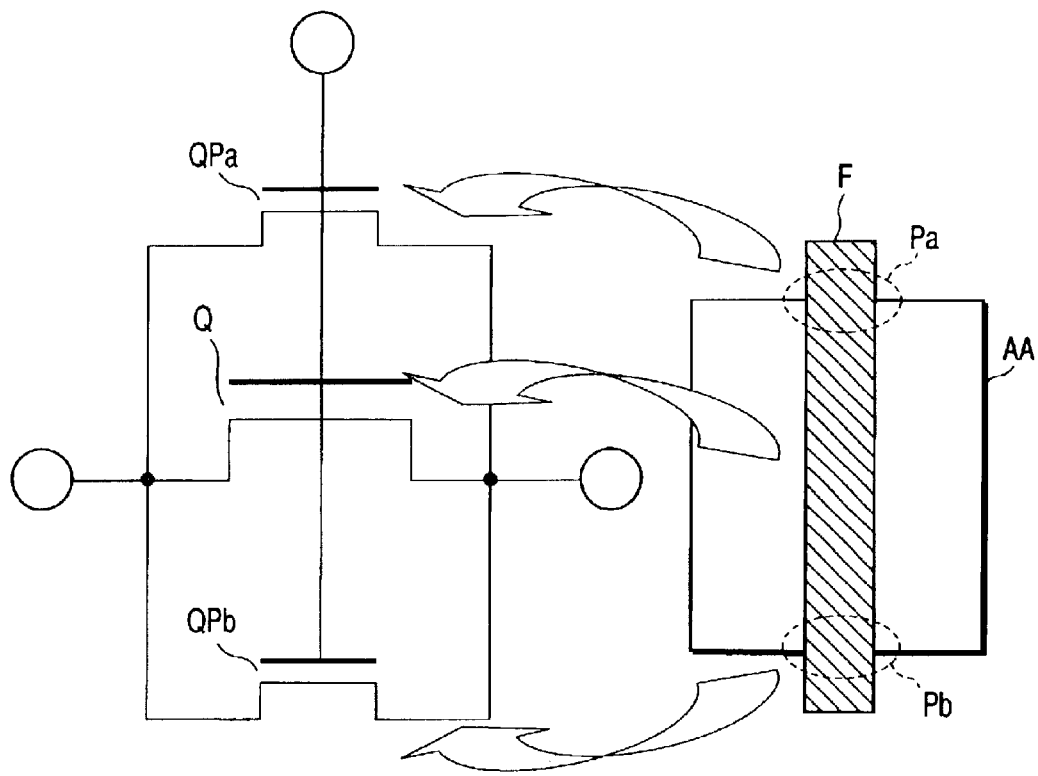
FIG. 2 is a conceptual diagram to explain generation of parasitic transistors.
Figure 3:
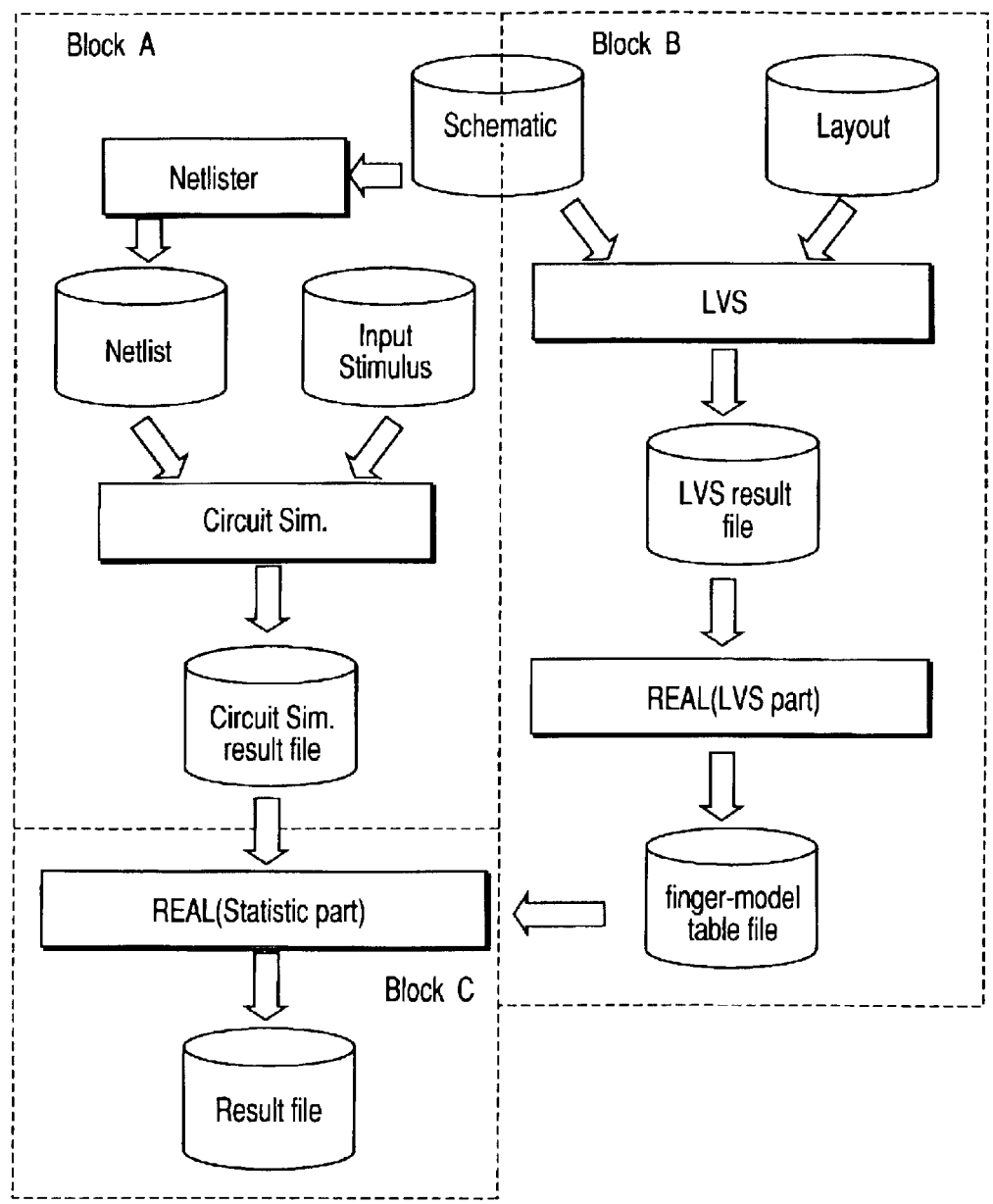
FIG. 3 is a flowchart showing an outline of software (programs) of CAD to explain a method of evaluating a semiconductor integrated circuit according to an embodiment of the present invention.

FIG. 3 is a flowchart showing an outline of software (programs) of CAD to explain a method of evaluating a semiconductor integrated circuit according to an embodiment of the present invention. This method includes three steps (blocks A, B and C).

The block A is a circuit simulation section to simulate a circuit design value. The circuit simulation section acquires a file including a bias state of a MOSFET using a circuit simulator and an input file (a netlist and an input stimulus). First a netlister is supplied with electric information of a schematic, i.e., data of a schematic of a semiconductor product to be manufactured, such as an IC and an LSI, and generates a netlist. Then, the circuit simulator (Circuit Sim.) simulates a circuit design value using data of the netlist and input stimulus and thus creates a file (circuit design value information indicating, e.g., bias states of respective elements) of simulation results (Circuit Sim. Result file). The circuit simulator performs the simulation using electric information such as channel length, channel width, device model, shape parameter, parasitic resistance, parasitic capacitance, and bias state. Using the information of the bias state, the circuit simulation result file comes to include information of a transistor that is cut off. This information allows standby DC leakage current to be evaluated more correctly.

The block B is an LVS (layout versus schematic) section. The LVS section extracts physical layout information from results of execution of LVS programs. First, the LVS section verifies whether data of a layout pattern and that of the schematic are equivalent to each other and creates a file of verification results (LVS result file). The number of fingers (or the number of edges) is used as an example of the physical layout information. Finger information (finger-model table file) is thus created from the LVS result file in line with the actual pattern layout (REAL (LVS part)).

The block C links the files output from the blocks A and B to obtain final results. Upon receiving the circuit simulation results from the block A and the finger information from the block B, the block C performs a circuit simulation (REAL Statistics part) in line with the actual pattern layout and evaluates a semiconductor integrated circuit to generate a file of evaluation results (Result file).

The processing of the block A and that of the block B can be performed in parallel with each other or one processing can be done after the other is completed.

Specific examples of the processing of the block B will now be described in detail.

Figure 4:
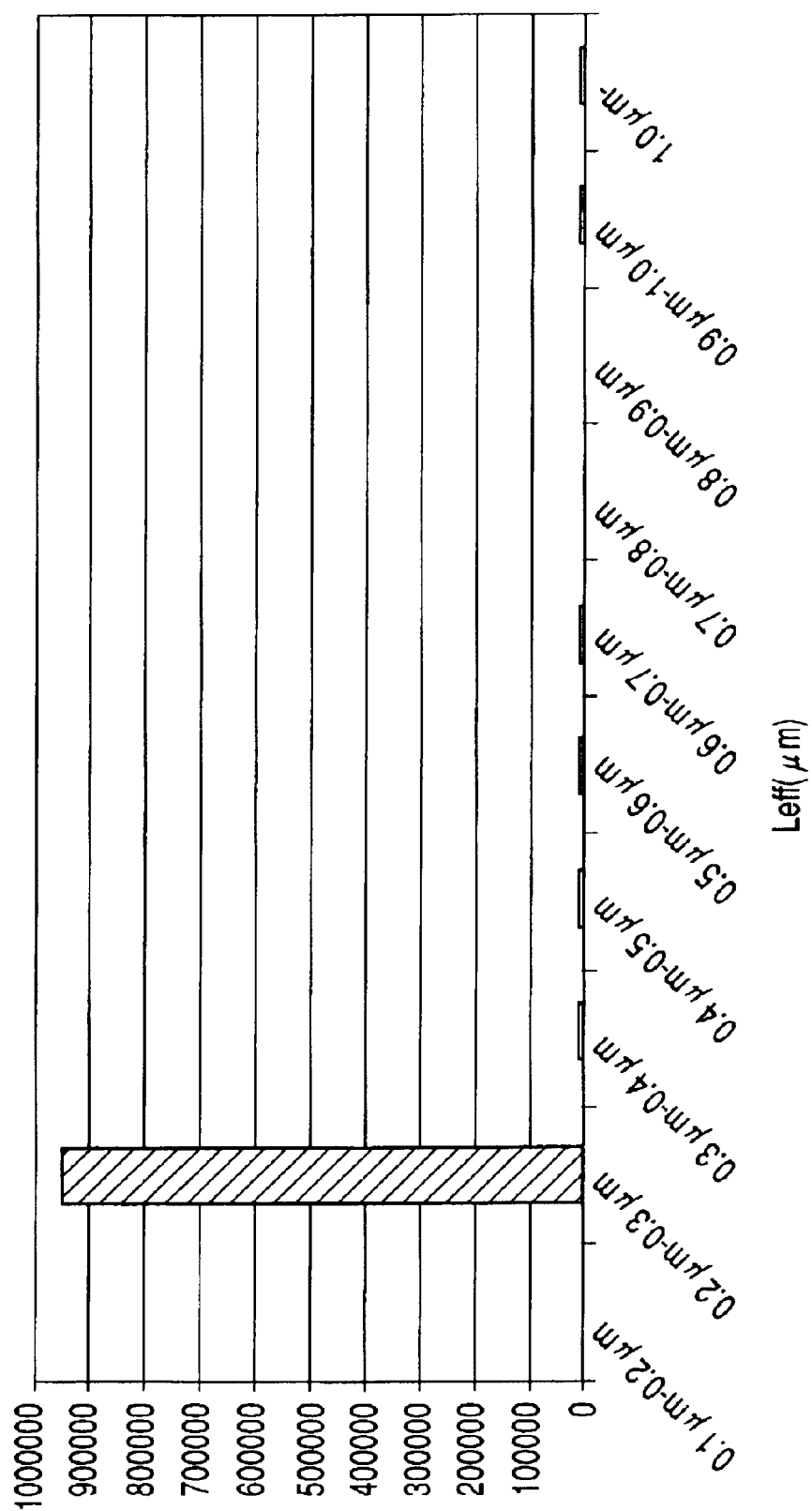
FIG. 4 is a diagram of the distribution of totals of channel widths of MOSFETs in the semiconductor integrated circuit for their respective effective channel lengths.

A first example is to determine the minimum threshold voltage Vth of a MOSFET. FIG. 4 shows the distribution of totals of channel widths of MOSFETs in a 256-Mbit DRAM for their respective ranges of effective channel lengths (Leff) from 0.1 $\mu$m to 0.2 $\mu$m, from 0.2 $\mu$m to 0.3 $\mu$m, from 0.3 $\mu$m to 0.4 $\mu$m, . . . In the first example, the MOSFETs are P-channel MOSFETs that are cut off in their precharge standby states. As is apparent from FIG. 4, the channel widths of MOSFETs concentrate in the range from 0.2 $\mu$m to 0.3 $\mu$m, and a total of the channel widths are about 95 cm. The effective channel length Leff is obtained by subtracting a value, which is two times as large as the lateral diffusion length Ld at the time of implantation of impurities into the source and drain regions, from the design channel length Ldes. That is, the effective channel length Leff is equal to (Ldes−2×Ld).

A MOSFET whose effective channel length is greater than 0.3 $\mu$m is used in an analog circuit, a DC-DC converter, and the like. The total of channel widths of such MOSFETs is much smaller than that within the range of the effective channel length from 0.2 $\mu$m to 0.3 $\mu$m.

Assuming that the S factor of the subthreshold gradient in a P-channel MOSFET is 130 mV/10, the minimum threshold voltage Vth is computed as follows:

$$Ioff = 10 \ \mu A/950{,}000 \ \mu m$$
$$= 1.05 \times 10^{-11} A/\mu m$$
$$= 10.5 \ pA/\mu m$$
$$Vthmin = -S \times \log[20 \ nA/Ioff]$$
$$= -130 \ mV \times \log[20 \ nA/10.5 \ pA]$$
$$= -426 \ mV$$

The threshold voltage Vth of the P-channel MOSFET is defined as a gate-to-source voltage Vgs from Ids=20 nA× (channel width/channel length). Therefore, the limit of leakage current Ioff of a transistor that is cut off is 10 $\mu$A.

Figure 5:
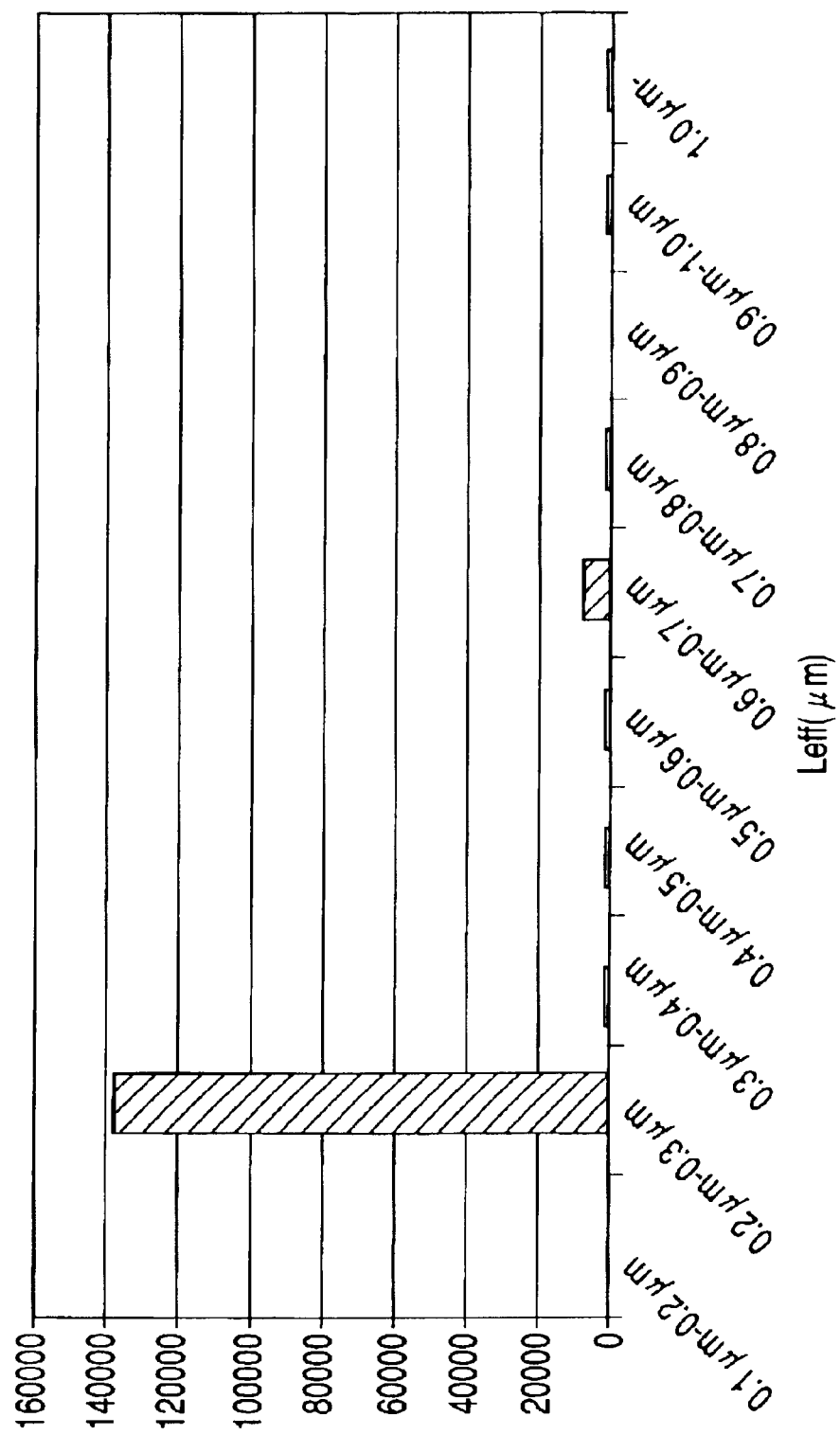
FIG. 5 is a diagram of the distribution of total numbers of fingers of MOSFETs in the semiconductor integrated circuit for their respective effective channel lengths.

A second example is to determine the maximum allowable decrease in threshold voltage for each finger. FIG. 5 shows the distribution of total numbers of fingers of MOSFETs in a 256-Mbit DRAM for their respective ranges of effective channel lengths (Leff) from 0.1 $\mu$m to 0.2 $\mu$m, from 0.2 $\mu$m to 0.3 $\mu$m, from 0.3 $\mu$m to 0.4 $\mu$m, . . . In the second example, the MOSFETs are P-channel MOSFETs that are cut off in their precharge standby states. As is apparent from FIG. 5, the fingers of MOSFETs concentrate in the range from 0.2 $\mu$m to 0.3 $\mu$m, too, and a total number of fingers are about 140,000.

Assuming that the limit of leakage current due to parasitic transistors formed at the edges of a p-channel MOSFET is 10 $\mu$A, an allowable current Ioff for each of the fingers (two edges) is computed as follows:

$$Ioff = 10 \ \mu A/140{,}000$$
$$= 71.4 \ pA/finger$$

Figure 6:
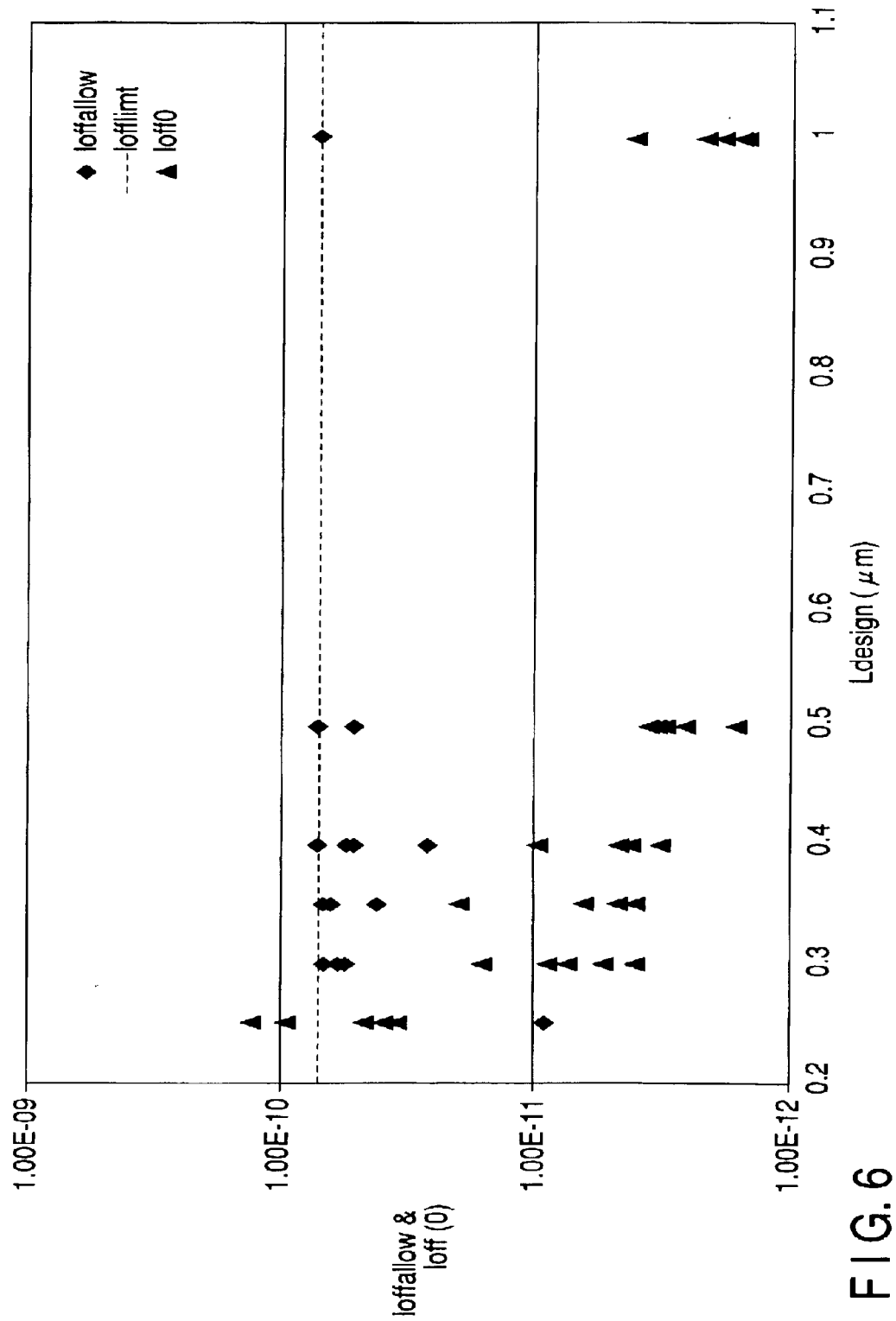
FIG. 6 is a plot of leakage currents flowing at the time of cutoff of a transistor that is forcibly degraded by burn-in and leakage currents at the time of cutoff of the transistor that is initialized, with respect to design values of channel lengths.

FIG. 6 is a plot of leakage currents Ioffallow flowing at the time of cutoff of a transistor that is forcibly degraded by burn-in and leakage currents Ioff0 flowing at the time of cutoff of a transistor that is initialized, with respect to design values Ldesign of channel lengths. In FIG. 6, the limit of leakage currents is represented by Iofflimit.

As is known, the leakage current of a transistor increases due to secular changes in an IC and an LSI. The increase in leakage current due to the secular changes is computed by the leakage currents Ioff0 and Ioffallow to prevent the specifications of the DRAM from not being satisfied. In other words, the optimum channel length Ldesign is determined in advance in consideration of secular changes.

Consequently, the minimum channel length Ldesign is 0.35 µm in the worst case.

According to the method described above, a semiconductor integrated circuit is evaluated using a circuit design value and actual pattern data. This evaluation can thus be performed more correctly and accurately in line with the actual pattern. Consequently, a highly reliable method of evaluating a semiconductor integrated circuit can be attained.

Various circuit parameters are determined by not approximation or estimation but the actual pattern layout data by applying the above-described evaluation method (software) when a semiconductor integrated circuit is designed. The circuit can thus be evaluated more correctly and accurately in line with the actual layout pattern. There is no fear that the semiconductor integrated circuit will not meet the specifications of standby DC leakage current.

Moreover, a technical solution that takes into consideration the degradation of a parasitic MOSFET due to edges was not provided until the present invention was made.

As described above, according to one aspect of the present invention, a semiconductor integrated circuit can be evaluated more correctly, accurately and reliably in line with the actual pattern layout using circuit design values and actual pattern layout data.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A method of evaluating a semiconductor integrated circuit, comprising:
    a first block which simulates a circuit design value, the first block creating a file including a bias state of a MOSFET using a circuit simulator and an input file;
    a second block which extracts physical layout information from results of execution of LVS programs; and
    a third block which acquires final results by linking an output file of the first block and that of the second block to each other,
    the first block including:
        inputting electric information of a schematic to a netlister and creating a netlist by the netlister; and
        performing a simulation by the circuit simulator using data of the netlist and an input stimulus and creating a file of simulation results,
    the second block including:
        verifying whether data of a layout pattern and that of the schematic are equivalent to each other and creating a file of verification results; and creating a finger-model table file from the file of verification result in line with an actual pattern layout, and
    the third block including:
        performing a circuit simulation in line with an actual pattern layout upon receiving the simulation results from the first block and the finger-model table file from the second block; and
        creating a result file by evaluation.

2. The method according to claim 1, wherein the input file includes a netlist and an input stimulus.

3. The method according to claim 1, wherein the electric information of the schematic is a schematic of a semiconductor product to be manufactured.

4. The method according to claim 1, wherein the file of simulation results is circuit design value information.

5. The method according to claim 4, wherein the circuit design value information is information indicating a bias state of each element.

6. The method according to claim 1, wherein the file of simulation results includes information of a transistor that is cut off.

7. The method according to claim 1, wherein the circuit simulator performs a simulation using electric information including a channel length, a channel width, a device model, shape parameter, parasitic resistance, parasitic capacitance, and a bias state of an element.

8. The method according to claim 7, wherein the channel length is set by computing an increase in leakage current due to secular changes based on leakage current flowing at a time of cutoff of a transistor that is initialized and leakage current flowing at a time of cutoff of the transistor that is forcibly degraded.

9. The method according to claim 1, wherein the second block is an LVS (layout versus schematic) section.

10. The method according to claim 9, wherein the second block determines a minimum threshold voltage of the MOSFET.

11. The method according to claim 9, wherein the second block determines a maximum allowable decrease in threshold voltage for each finger of a multi-finger transistor.

12. The method according to claim 1, wherein the physical layout information includes one of the number of fingers of a multi-finger transistor and that of edges thereof.

* * * * *